(12) United States Patent
Kim et al.

(10) Patent No.: US 10,955,725 B2
(45) Date of Patent: Mar. 23, 2021

(54) BEAM STEERING DEVICE AND ELECTRONIC DEVICE INCLUDING THE SAME

(71) Applicant: SAMSUNG ELECTRONICS CO., LTD., Suwon-si (KR)

(72) Inventors: Sunil Kim, Osan-si (KR); Junghyun Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 167 days.

(21) Appl. No.: 16/159,173

(22) Filed: Oct. 12, 2018

(65) Prior Publication Data
US 2020/0006923 A1 Jan. 2, 2020

(30) Foreign Application Priority Data
Jun. 27, 2018 (KR) .......... 10-2018-0074182

(51) Int. Cl.
*G02F 1/29* (2006.01)
*H01S 5/40* (2006.01)

(52) U.S. Cl.
CPC .......... *G02F 1/292* (2013.01); *G02F 2203/02* (2013.01); *G02F 2203/24* (2013.01); *H01S 5/4075* (2013.01)

(58) Field of Classification Search
CPC ........ G02F 1/292; G02F 1/29; G02F 2203/24; G02F 2203/02; H01S 3/0071; H01S 5/4075; G02B 26/06

USPC .......................................................... 359/318
See application file for complete search history.

(56) References Cited

U.S. PATENT DOCUMENTS

| | | | |
|---|---|---|---|
| 9,547,186 B2 | 1/2017 | Han et al. | |
| 9,887,456 B2 | 2/2018 | Bily et al. | |
| 2007/0291831 A1 | 12/2007 | Lee et al. | |
| 2016/0170288 A1 | 6/2016 | Moon et al. | |
| 2017/0090221 A1 | 3/2017 | Atwater | |
| 2017/0153528 A1 | 6/2017 | Kim et al. | |
| 2018/0136537 A1* | 5/2018 | Kim .................. | G02F 1/292 |

FOREIGN PATENT DOCUMENTS

| | | | | |
|---|---|---|---|---|
| EP | 3410184 A1 * | 12/2018 | ............... | G02F 1/29 |
| KR | 10-0735319 B1 | 7/2007 | | |
| KR | 10-2012-0077417 A | 7/2012 | | |
| KR | 10-2017-0062093 A | 6/2017 | | |
| KR | 2018/0055298 | * 5/2018 | ............. | G02B 26/06 |

* cited by examiner

*Primary Examiner* — Kristina M Deherrera
(74) *Attorney, Agent, or Firm* — Sughrue Mion, PLLC

(57) ABSTRACT

A beam steering device is provided and includes: a first layer including a plurality of reflection regions; a second layer on the first layer and including a plurality of refractive-index-variable regions, each having a refractive index that is controlled by an applied voltage; an antenna layer on the second layer and including a plurality of nano-structures; and a driving circuit layer on a lower side of the first layer and comprising a plurality of circuit units, each respectively configured to control a voltage applied to one of the refractive-index-variable regions. The antenna layer is divided into a first region configured to control a travelling direction of incident light and a second region that is not configured to control the travelling direction of the incident light.

20 Claims, 7 Drawing Sheets

BEAM STEERING DEVICE AND ELECTRONIC DEVICE INCLUDING THE SAME

CROSS-REFERENCE TO RELATED APPLICATION

This application claims priority from Korean Patent Application No. 10-2018-0074182, filed on Jun. 27, 2018, in the Korean Intellectual Property Office, the disclosure of which is incorporated herein in its entirety by reference.

BACKGROUND

1. Field

Apparatuses consistent with example embodiments relate to beam steering devices configured to control a travelling direction of a beam.

2. Description of the Related Art

In a processing method using a laser, various methods are used to steer a laser beam to a desired location. One related art method includes mechanically rotating a laser irradiation part. Another related art method includes using the interference among outputs of a laser bundle of various pixels or a waveguide shape by using an optical phased array (OPA) method.

In order to mechanically rotate a laser irradiation part, a motor or a micro electro-mechanical system (MEMS) structure may be used. In such a case, a volume of the laser steering device is increased and the cost may be increased. In the case of a motor, unwanted noise may be generated, but when a MEMS structure is used, it may be accompanied by unwanted vibration. Thus, there are limitations in the use of such a mechanical rotation system.

In the case of an OPA control method, every pixel or waveguide needs a pixel driver, and another driver for driving the pixel driver is needed. Thus, the necessary circuit and device are complex, and accordingly, a processing cost may be increased.

Recently, there have been reports on a technique of steering a laser by controlling a phase or reflectivity of a beam incident onto an antenna region by changing the refractive index of an active region using a meta device formed of an antenna region including nano-sized antennas and an active region having a variable refractive index.

SUMMARY

One or more example embodiments may provide beam steering devices having increased emission efficiency.

Additional example aspects and advantages will be set forth in part in the description which follows and, in part, will be apparent from the description, or may be learned by practice of the presented example embodiments.

According to an aspect of an example embodiment, a beam steering device for controlling a travelling direction of incident light, includes: a first layer including a plurality of reflection regions; a second layer on the first layer and including a plurality of refractive-index-variable regions, each having a refractive index that is controlled by an applied voltage; an antenna layer on the second layer and including a plurality of nano-structures having at least one sub-wavelength size dimension; and a driving circuit layer on a lower side of the first layer and including a plurality of circuit units respectively configured to control a voltage applied to one of the refractive-index-variable regions, wherein the antenna layer is divided into a first region where a travelling direction of the incident light is controlled and a second region where the travelling direction of the incident light is not controlled.

The first region may be closer to a center of the antenna layer than the second region.

The second region may surround the first region.

A distribution of size or shape of the nano-structures included in the first region may be less than a distribution of size or shape of the nano-structures included in the second region.

The refractive-index-variable regions may be provided at locations corresponding to the first region.

A material different from that of the refractive index-variable regions may be provided in regions of the second layer other than the refractive-index-variable regions.

The reflection regions of the first layer may be provided at locations corresponding to the first region of the antenna layer.

A material different from that of the reflection regions may be provided in regions of the first layer other than the reflection regions.

The reflection regions of the first layer may be provided at locations corresponding to the first region of the antenna layer.

A material different from that of the reflection regions may be provided in regions of the first layer other than the reflection regions.

A same material may be provided in regions of the first layer other than the reflection regions and in regions of the second layer other than the refractive-index-variable regions.

The circuit units of the driving circuit layer may be provided at locations corresponding to the first region.

The beam steering device may further include a controller configured to control the circuit units included in the driving circuit layer.

The controller may control the circuit units corresponding to the first region, from among the circuit units, such that at least one voltage is applied between the nano-structures included in the first region and the reflection regions at a location of the first layer corresponding to the first region.

The refractive-index-variable regions may include a semiconductor material.

The beam steering device may further include a first insulating layer between the second layer and the antenna layer.

The beam steering device may further include a second insulating layer between the second layer and the first layer.

According to an aspect of another example embodiment, an electronic device includes: a light source; the beam steering device described above, configured to direct light incident from the light source towards an object by controlling a travelling direction of the light; a receiver configured to receive light reflected from the object; and a processor configured to analyze light received by the receiver.

In the beam steering device, a distribution of a size and a shape of the nano-structures included in the first region may be less than that of a size and shape of the nano-structures included in the second region.

In the beam steering device, at least one of the refractive-index-variable regions and the reflection regions may only be provided at locations corresponding to the first region and may be omitted from a region corresponding to the second region.

BRIEF DESCRIPTION OF THE DRAWINGS

These and/or other example aspects and advantages will become apparent and more readily appreciated from the following description of the example embodiments, taken in conjunction with the accompanying drawings in which.

DETAILED DESCRIPTION

Figure 1:
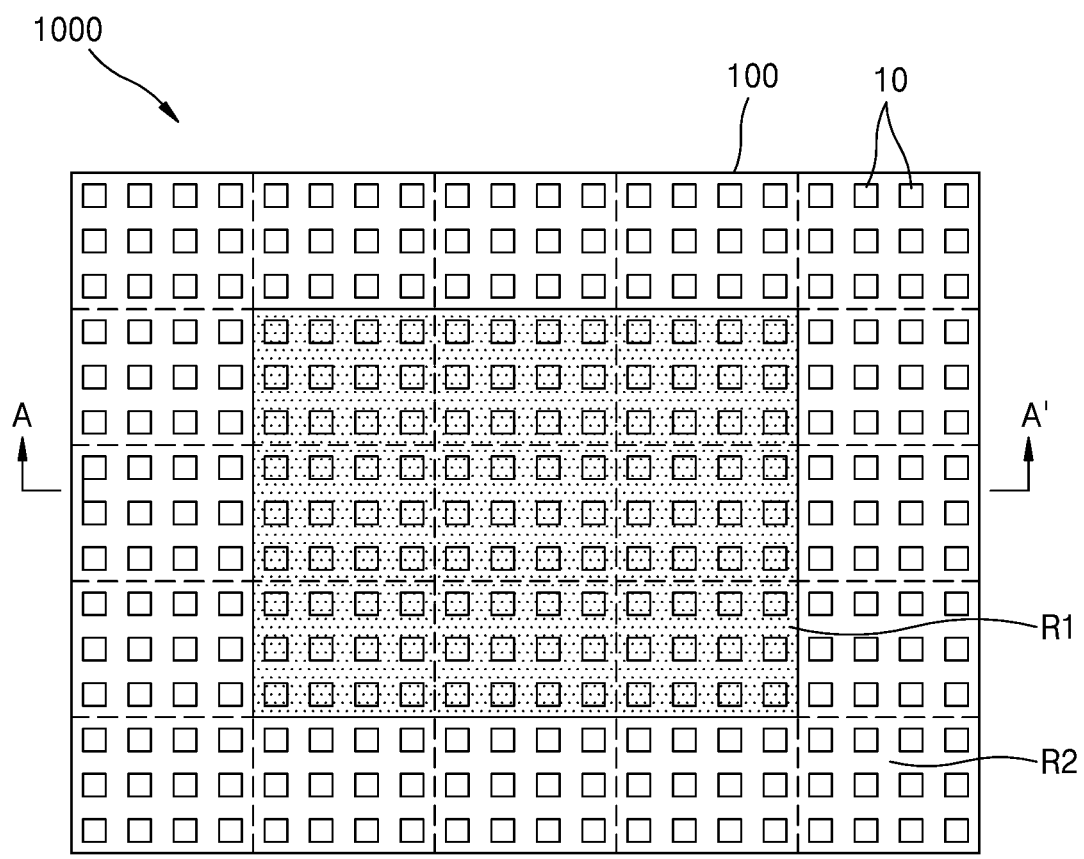
FIG. 1 is a schematic plan view of a beam steering device according to an example embodiment.

Beam steering devices according to example embodiments and an electronic device including the beam steering devices will now be described in detail with reference to the accompanying drawings. In the drawings, like reference numerals refer to like elements throughout the detailed description, and sizes or thickness of constituent elements may be exaggerated for clarity of explanation.

It will be understood that, although the terms "first", "second", etc. may be used herein to describe various elements, the elements should not be limited by these terms. These terms are only used to distinguish one element from another element. The beam steering devices and the electronic device including the beam steering devices may be realized in various types, and thus, are not limited to the example embodiments described below.

Also, in the entire specification, it should be understood that, when a part "comprises" or "includes" a constituent element in the specification, unless otherwise defined, it is not excluding other elements but may further include other elements.

FIG. 1 is a schematic plan view of a beam steering device 1000 according to an example embodiment.

Referring to FIG. 1, an antenna layer 100 including a plurality of nano-structures 10 having a sub-wavelength size may be arranged on an uppermost layer of the beam steering device 1000. Each of the nano-structures 10 is an artificial structure having a shape with a dimension of a sub-wavelength, and may strongly interact with light of a predetermined wavelength band. Here, the term "sub-wavelength" may denote a size less than a wavelength of light to be modulated, that is, a size less than an operational wavelength of the nano-structures 10.

The antenna layer 100 may include a first region R1 and a second region R2. The first region R1 may be a steering region which controls a travelling direction of light incident on the antenna layer 100, and the second region R2 may be a non-steering region which does not control the travelling direction of the incident light.

In an example embodiment, the antenna layer 100 is divided into the first region R1 and the second region R2 considering that, although the nano-structures 10 are designed to have the same size and shape, the size and shape of the nano-structures 10 may not be exactly the same but may have a variance in size and/or shape due to an error in a manufacturing process.

The first region R1 and the second region R2 may be divided so that the distribution of the size and shape of the nano-structures 10 in the first region R1 is less than that of the size and shape of the nano-structures 10 in the second region R2. In FIG. 1, the size of all of the nano-structures 10 is depicted as the same for convenience. The number of the nano-structures 10 included in the first region R1 and the number of the nano-structures 10 included the second region R2 are also an example, and thus, are not limited thereto. Furthermore, the first region R1 may be located in a central region of the antenna layer 100, as compared to the second region R2, for example, the first region R1 may be arranged to be surrounded by the second region R2.

Figure 2:
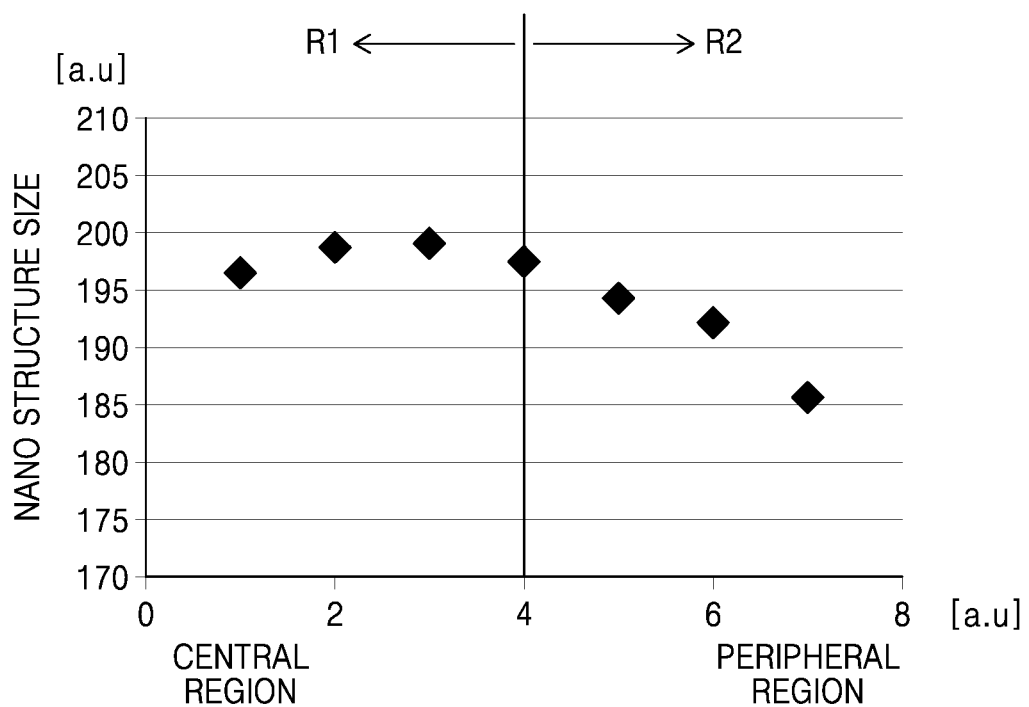
FIG. 2 is a graph schematically showing a relative size of a nano-structure for each location on an antenna layer of FIG. 1.

FIG. 2 is a graph schematically showing a relative size of the nano-structure for each location on the antenna layer of FIG. 1.

In FIG. 2, a vertical axis indicates a relative size of the nano-structures 10. A horizontal axis indicates a relative location of the nano-structures 10 on the antenna layer 100, where '0' denotes a center of the antenna layer 100, and the lower numbers indicate a position closer to the center of the antenna layer 100.

Referring to FIG. 2, the size of the nano-structures 10 included in the antenna layer 100 is not uniform. In the central region, the size of the nano-structure 10 is relatively uniform, but, FIG. 2 illustrates a tendency that the size of the nano-structures decreases toward the peripheral region. The reason why the size of the nano-structures 10 is not uniform is because the nano-structures 10 may be easily affected by peripheral patterns during a manufacturing process. For example, the peripheral patterns may affect an exposure process for forming the nano-structures 10. The graph, shows only a distribution of size of the nano-structures 10, but the distribution of shape of the nano-structures 10 may also be similarly expressed. The variance of size or shape of the nano-structures 10 may be relatively greater towards a peripheral region of the antenna layer 100. Also, the variance of size or shape of the nano-structures 10 may be relatively small towards the center region of the antenna layer 100.

Due to the distribution of the shape and size of the nano-structures 10, a problem of reducing the efficiency of the beam steering device 1000 may occur as below. When a travelling direction of a beam is steered using the beam steering device 1000 including the antenna layer 100, the size or shape of the nano-structures 10 included in the antenna layer 100 may be parameters determining steering the travelling direction of the beam. For example, the beam steering device 1000 including the nano-structures 10 having the same size and shape may steer a beam to a desired location. For beam steering, refractive index-variable regions and reflection regions are provided below the nano-structures 10, which will be described below with reference to FIG. 3. When the size or shape of the nano-structures 10 on the antenna layer 100 varies from location to location, although the change of refractive index in the refractive index-variable regions provided below the antenna layer 100 is the same, a difference of phase and reflectivity of a beam reflected by the reflection regions may be generated in each location. Thus, a parasitic peak may be generated an undesired location, thereby reducing resolution and emission efficiency of the beam steering device 1000.

To reduce the problems described above, the beam steering device 1000 according to an example embodiment pre-estimates the degree of variance of the nano-structures 10, and thus, sets the [variance of the nanostructures— distribution of the sizes/shapes] boundaries of the first region R1 and the second region R2. That is, a region in which the distribution of size and shape of the nano-structures 10 is relatively uniform is determined as a driving region, that is, the first region R1 for beam steering, and a region in which the distribution of size and shape is relatively large is determined as a non-driving region, that is, the second region R2 for non-beam steering. As a result, the first region R1 includes the nano-structures 10 having a comparatively uniform size and shape due to almost no variance due to the process of manufacturing, and thus, may reflect incident light with a constant phase and reflectivity, thereby steering the beam to a desired location.

Figure 3:
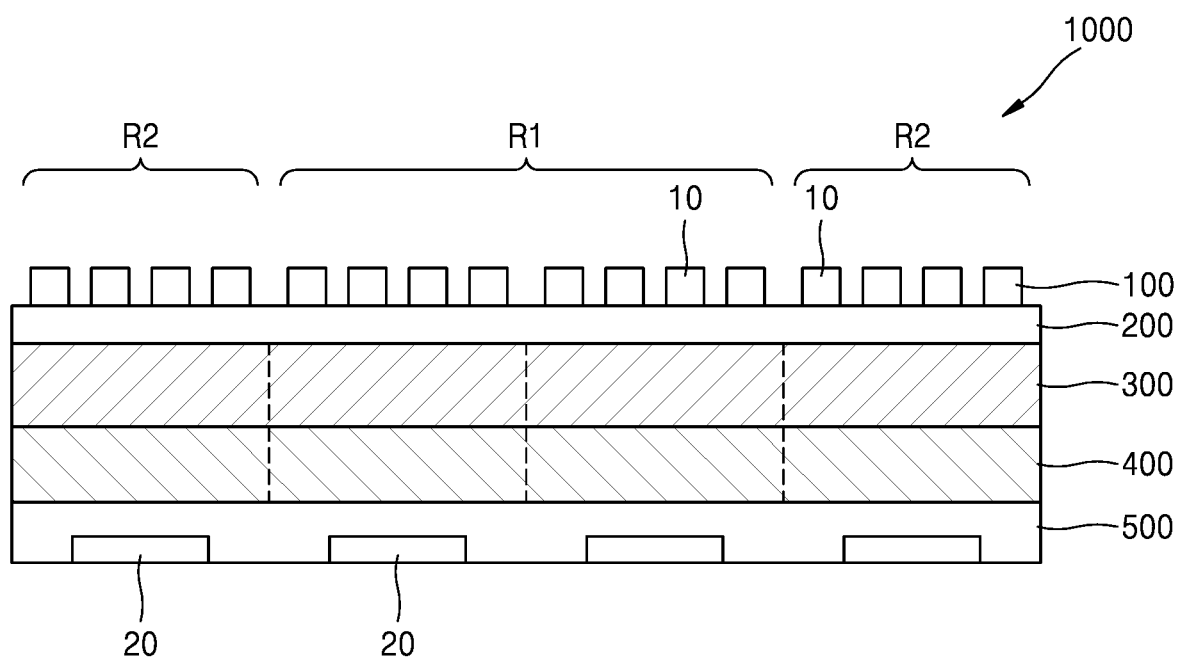
FIG. 3 is a cross-sectional view taken along line A-A' of the beam steering device of FIG. 1.

FIG. 3 is a cross-sectional view taken along a line A-A' of the beam steering device 1000 of FIG. 1;

Referring to FIG. 3, the beam steering device 1000 includes: a first layer 400 including a plurality of reflection regions; a second layer 300 on the first layer 400 and including a plurality of refractive index-variable regions having refractive indexes controlled by an applied voltage; the antenna layer 100 above the second layer 300 and including a plurality of nano-structures 10 having a sub-wavelength size; and a driving circuit layer 500 on a lower side of the first layer 400 and including a plurality of circuit units 20 respectively configured to control voltages applied to the refractive index-variable regions. The antenna layer 100 may be divided into the first region R1 configured to control a travelling direction of incident light and a second region R2 not configured to control a travelling direction of the incident light Also, the beam steering device 1000 may further include a first insulating layer 200 arranged between the second layer 300 and the antenna layer 100.

As described above. the antenna layer 100 may include a plurality of nano-structures 10 having a sub-wavelength size. Also, the antenna layer 100 may include the first region R1 and the second region R2. The first region R1 may be a steering region which controls the travelling direction of light incident to the antenna layer 100, and the second region R2 may be a non-steering region which does not control the travelling direction of incident light. Also, the first region R1 may be closer to a center of the antenna layer 100 as compared to the second region R2, and the first region R1 is arranged to be surrounded by the second region R2.

The first insulating layer 200 may include an insulating material, such as a metal oxide, and is arranged between the antenna layer 100 and the second layer 300 to electrically insulate the antenna layer 100 from the second layer 300. The first insulating layer 200 may include, for example, aluminum oxide, silicon oxide, etc., and may include at least one of $SiO_2$, $SiN$, $Al_2CO_3$, $HfO_2$, or a combination thereof.

The refractive index-variable regions of the second layer 300 may include a material, optical characteristics of which are changed according to a voltage applied thereto. The material may be, for example, a transparent conductive oxide (TCO), such as indium tin oxide (ITO), indium zinc oxide (IZO), aluminum zinc oxide (AZO), and allium zinc oxide (GZO). Also, the refractive index-variable regions may include a transition metal nitride, such as TiN, ZrN, HfN, and TaN, besides above, may include an electro-optic material, an effective dielectric constant thereof is changed when an electrical signal is applied, that is, $LiNbO_3$, $LiTaO_3$, potassium tantalate niobate (KTN), and lead zirconate titanate (PZT), and also, may include any of various polymers having electro-optic characteristics. Also, the electro-optic characteristics that vary according to a voltage may be a refractive index of the refractive index-variable regions of the second layer 300. Accordingly, the travelling direction of light transmitted by the second layer 300 may be changed according to a voltage applied to the second layer 300 from an outside source.

The first layer 400 may perform a function of reflecting light transmitted through the second layer 300, and may be a mirror layer. The first layer 400 may include at least one material selected from the group consisting Au, Ag, Pt, Cu, Al, Ni, Fe, Co, Zn, Ir, Ti, Ru, Rh, Pd, or Os.

The driving circuit layer 500 may include a plurality of circuit units 20 configured to control a voltage applied to the second layer 300. The circuit units 20 may be two dimensionally arranged and each may include a transistor and a capacitor.

The driving circuit layer 500 may apply a voltage to the first layer 400 so that the antenna layer 100 including the nano-structures 10 is driven as a beam steering element. The antenna layer 100 may be grounded, and accordingly, an electrical potential difference may be generated between the antenna layer 100 and the first layer 400 by a voltage applied to the first layer 400. Due to the change of the electrical potential difference as a result of controlling the voltage applied to the first layer 400, the change of carrier concentration of the second layer 300 arranged between the antenna layer 100 and the first layer 400 may occur. A dielectric constant, in detail, a dielectric constant characteristic of the second layer 300 with respect to a wavelength is changed by the change of the carrier concentration, and as a result, the refractive index of the second layer 300 may be changed. As the change of the refractive index of the second layer 300, a travelling direction of incident light incident on the second layer 300 from the antenna layer 100 may be changed.

Also, the beam steering device 1000 may further include a controller (not shown) for controlling the circuit units 20 included in the driving circuit layer 500. The controller may control the circuit units 20 of the circuit units 20 corresponding to the location of first region R1 so that a voltage is applied between a region of the antenna layer 100, where the nano-structures 10 included in the first region R1 are located, and a region of the first layer 400 corresponding to the location of the first region R1. Therefore, an electrical potential difference may be generated only in a part of the second layer 300 corresponding to the first region R1 arranged between the antenna layer 100 corresponding to the first region R1 and the first layer 400 located corresponding to the first region R1, and accordingly, the refractive index of the part of a region of the second layer 300 corresponding to the first region R1 may be changed. According to the change of the refractive index of the part of the second layer 300 corresponding to the first region R1, the travelling direction of light incident on the second layer 300 corresponding to the first region R1 through the antenna layer 100 corresponding to the first region R1 may be changed.

As a result, a beam steering function according to the change of the refractive index may function only in some regions of the second layer 300 arranged on a location corresponding to the first region R1 in which the nano-structures 10 having a relatively small variance. As described above, the beam may further be precisely steered to a desired location by using the first region R1 which is a region having the nano-structures 10 having a small distribution of size and shape, which are some of the parameters effecting beam steering. The method of using the first region R1 as the steering region, in addition to the method of controlling a voltage, may include a method of changing a structure of the beam steering device 1000, which will be described below.

Figure 4:
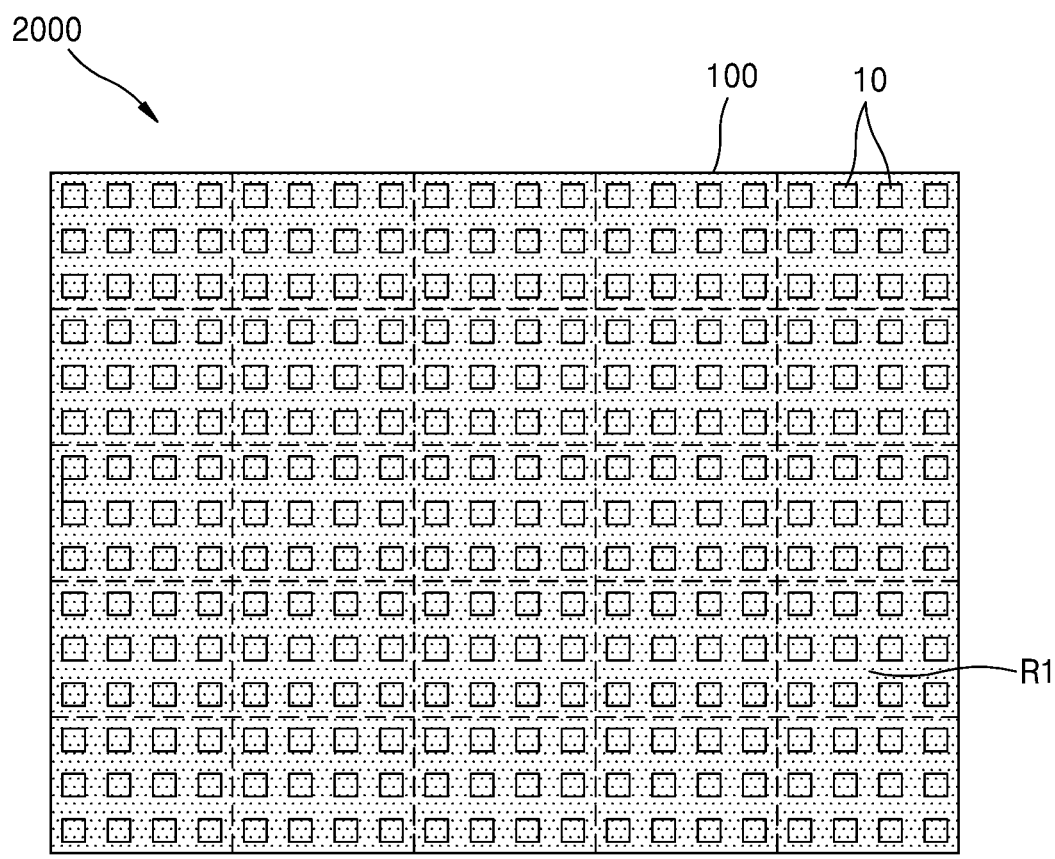
FIG. 4 is a schematic plan view of a beam steering device according to a comparative example.

FIG. 4 is a schematic plan view of a beam steering device 2000 according to a comparative example.

Referring to FIG. 4, an entire region of the antenna layer 100 including the nano-structures 10 having a sub-wavelength size included in the beam steering device 2000 may be considered to be within the first region R1. The size and shape of the nano-structures 10 included in the first region R1 may not be uniform.

In this way, when the entire region of the antenna layer 100 is used as the first region R1, that is, as a steering region to control the travelling direction of incident light, due to the non-uniformity of the shape of the nano-structures 10 according to locations of the antenna layer 100, a problem may occur that a beam may not be steered to a desired location.

Figure 5:
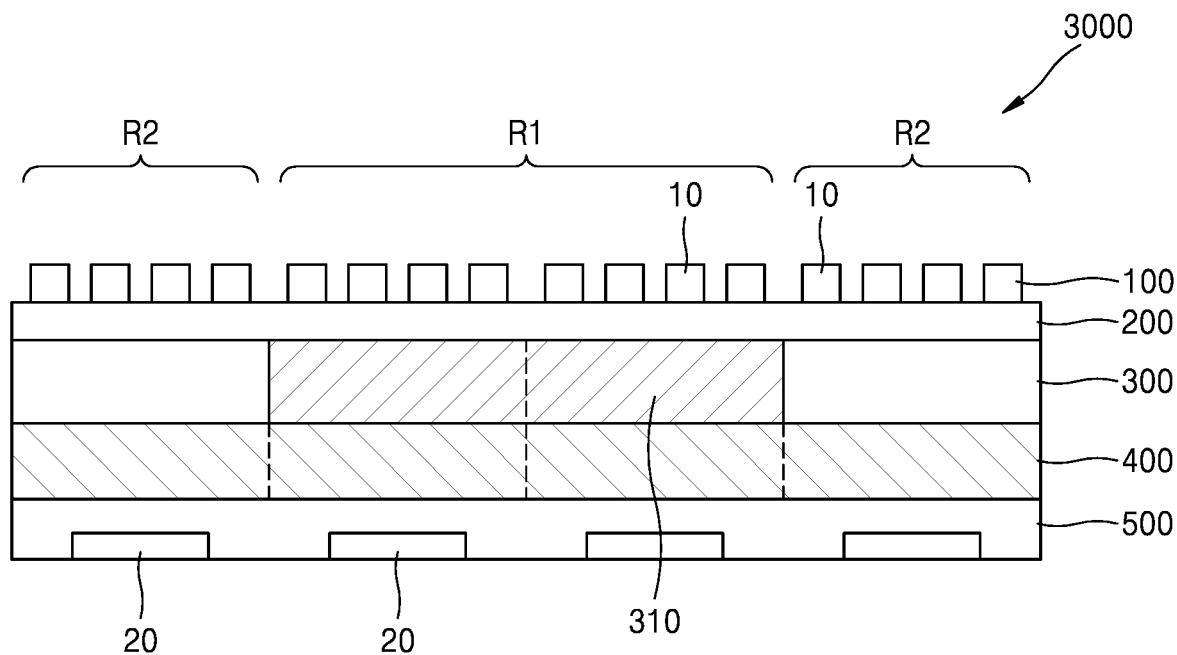
FIG. 5 is a schematic lateral cross-sectional view of a beam steering device according to another example embodiment.

FIG. 5 is a schematic plan view of a beam steering device 3000 according to another example embodiment.

Referring to FIG. 5, a beam steering device 3000 for controlling a travelling direction of incident light, according to an example embodiment, may include: a first layer 400 including a plurality of reflection regions; a second layer 300 on the first layer 400 and including a plurality of refractive index-variable regions 310 having a refractive index that is controlled by an applied voltage; an antenna layer 100 above the second layer 300 and including a plurality of nano-structures 10 having a sub-wavelength size; and a driving circuit layer 500 on a lower side of the first layer 400 and including a plurality of circuit units 20 respectively configured to control a voltage applied to the refractive index-variable regions 310. The antenna layer 100 may be divided into a first region R1 configured to control a travelling direction of incident light and a second region R2 configured not to control a travelling direction of the incident light. Also, the beam steering device 3000 may further include a first insulating layer 200 arranged between the second layer 300 and the antenna layer 100. Constituent materials of each of the layers in the beam steering device 3000 may be the same as the constituent materials of each of the layers in the beam steering device 1000 of FIG. 3.

Also, the refractive index-variable regions 310 of the second layer 300 may be arranged on a location of the second layer 300 corresponding to the first region R1. In this case, a material different from the refractive index-variable regions 310 may be provided in regions of the second layer 300 other that the refractive index-variable regions 310. A material that may be included in the regions besides the refractive index-variable regions 310 of the second layer 300 may be the same as a material included in the first insulating layer 200.

As described above, a travel direction of light incident through the antenna layer 100 may be changed according to the change of a refractive index of the refractive index-variable regions 310 of the second layer 300. Also, since the refractive index-variable regions 310 of the second layer 300 are arranged on a location corresponding to the first region R1, the travelling direction of light incident to the antenna layer 100 may be changed at the first region R1. In this way, the first region R1 in which the size and shape of the nano-structures 10 are comparatively uniform is used as a steering region by arranging the refractive index-variable regions 310 on a location of the second layer 300 corresponding to the first region R1, and thus, the efficiency of beam steering function of the beam steering device 3000 may be increased.

Figure 6:
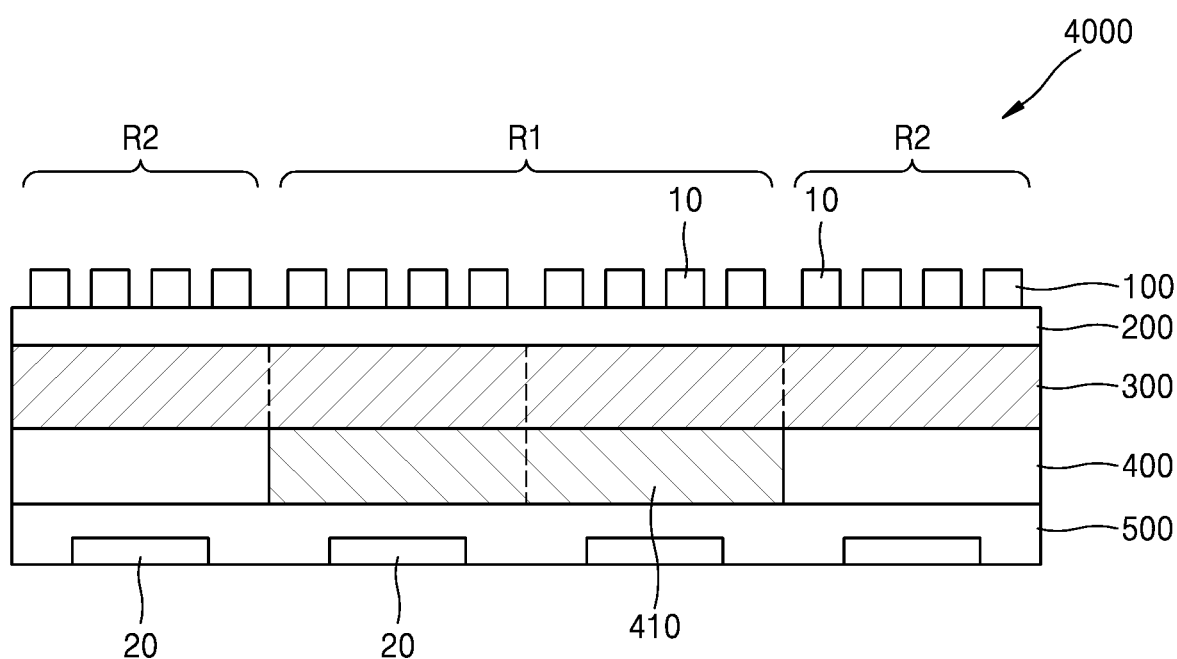
FIG. 6 is a schematic lateral cross-sectional view of a beam steering device according to another example embodiment.

FIG. 6 is a schematic plan view of a beam steering device 4000 according to another example embodiment.

Referring to FIG. 6, the beam steering device 4000 for controlling a travelling direction of incident light may include: a first layer 400 including a plurality of reflection regions 410; a second layer 300 on the first layer 400 and including a plurality of refractive index-variable regions having a refractive index that is controlled by an applied voltage; an antenna layer 100 above the second layer 300 and including a plurality of nano-structures 10 having a sub-wavelength size; and a driving circuit layer 500 on a lower side of the first layer 400 and including a plurality of circuit units 20 respectively configured to control a voltage applied to the refractive index-variable regions. The antenna layer 100 may be divided into a first region R1 configured to control a travelling direction of incident light and a second region R2 not configured to control a travelling direction of the incident light. Also, the beam steering device 4000 may further include a first insulating layer 200 arranged between the second layer 300 and the antenna layer 100. Constituent materials of each of the layers in the beam steering device 4000 may be the same as the constituent materials of each of the layers in the beam steering device 1000 of FIG. 3.

Also, the reflection regions 410 of the first layer 400 may be provided on a location of the first layer 400 corresponding to the first region R1. In this case, a material different from the reflection regions 410 may be provided in regions of the first layer 400 other than the reflection regions 410. The material that may be provided in the regions besides the reflection regions 410 of the first layer 400 may be the same as a material included in the first insulating layer 200.

As described above, a travelling direction of light incident through the antenna layer 100 may be changed according to the change of a refractive index of the refractive index-variable regions of the second layer 300. The incident light, the travelling direction whereof is changed may be reflected by the reflection regions 410 of the first layer 400, and then, may be directed to the outside of the beam steering device 4000. In this way, the beam steering device 4000 depicted in FIG. 6 includes the reflection regions 410 of the first layer 400 on a location of the first layer 400 corresponding to the first region R1, thus, the incident light may be reflected by the reflection regions 410 in the first region R1 and may be directed to the outside of the beam steering device 4000. Light, the travel direction of which is changed by the refractive index-variable regions of the second layer 300 corresponding to the second region R2 on which the reflection regions 410 of the first layer 400 is not provided may not be reflected, and thus, may not be directed to the outside of the beam steering device 4000. In this way, the first region R1 in which the size and shape of the nano-structures 10 are comparatively uniform is used as a steering region by providing the reflection regions 410 on a location of the first layer 400 corresponding to the first region R1, and thus, the efficiency of beam steering function of the beam steering device 4000 may be increased.

Figure 7:
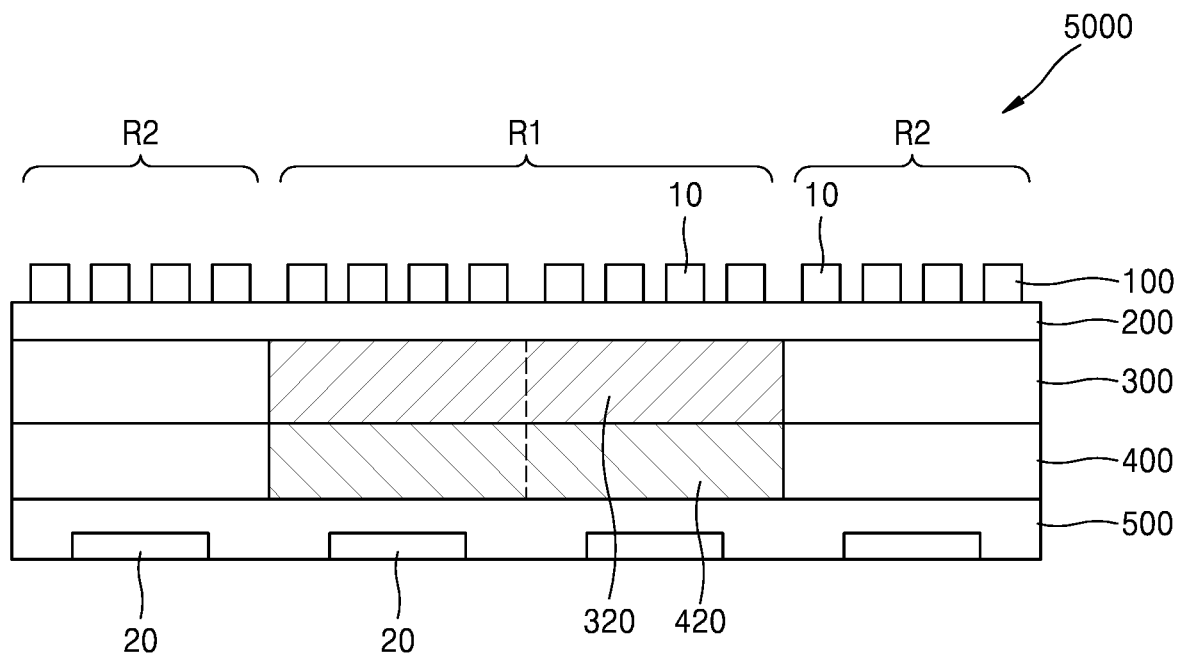
FIG. 7 is a schematic lateral cross-sectional view of a beam steering device according to another example embodiment.

FIG. 7 is a schematic lateral cross-sectional view of a beam steering device 5000 according to another example embodiment.

Referring to FIG. 7, the beam steering device 5000 for controlling a travelling direction of incident light may include: a first layer 400 including a plurality of reflection regions 420; a second layer 300 on the first layer 400 and including a plurality of refractive index-variable regions 320 having a refractive index that is controlled by an applied voltage; an antenna layer 100 above the second layer 300 and including a plurality of nano-structures 10 having a sub-wavelength size; and a driving circuit layer 500 on a lower side of the first layer 400 and including a plurality of circuit units 20 respectively configured to control a voltage applied to the refractive index-variable regions 320. The antenna layer 100 may be divided into a first region R1 configured to control a travelling direction of incident light and a second region R2 not configured to control a travelling direction of the incident light. Also, the beam steering device 5000 may further include a first insulating layer 200 arranged between the second layer 300 and the antenna layer 100. Constituent materials of each of the layers in the beam steering device 5000 may be the same as the constituent materials of each of the layers in the beam steering device 1000 of FIG. 3.

Also, the refractive index-variable regions 320 of the second layer 300 and the reflection regions 420 of the first layer 400 respectively may be provided on locations of the second layer 300 and the first layer 400 corresponding to the first region R1. In this case, in the second layer 300, a material different from the refractive index-variable regions 320 may be provided in regions other than the refractive index-variable regions 320. Also, in the first layer 400, a material different from the reflection regions 420 may be provided in regions of the first layer 400. A material that may be provided in the regions other than the refractive index-variable regions 320 of the second layer 300 and in the regions other than the reflection regions 420 of the first layer 400 may be the same as a material included in the first insulating layer 200.

As described above, a travelling path of light incident through the antenna layer 100 may be changed according to the change of refractive index of the refractive index-variable regions 320 of the second layer 300. Also, since the refractive index-variable regions 320 are arranged on a location of the second layer 300 corresponding to the first region R1, the travelling path of the light incident to the antenna layer 100 may be changed in the first region R1.

Also, the incident light, the travelling path of which is changed is reflected by the reflection regions 420 of the first layer 400, and may be directed to the outside of the beam steering device 5000. Accordingly, since the beam steering device 5000 depicted in FIG. 7 includes the reflection regions 420 on a region of the first layer 400 corresponding to the first region R1, the incident light may be reflected by the reflection regions 420 in the first region R1, and may be directed to the outside of the beam steering device 5000.

In this way, the first region R1 in which the size and shape of the nano-structures 10 are uniform is used as a steering region by respectively arranging the refractive index-variable regions 320 and the reflection regions 420 on locations of the first layer 300 and the second layer 400 corresponding to the first region R1, and thus, the efficiency of beam steering function of the beam steering device 5000 may be increased.

Figure 8:
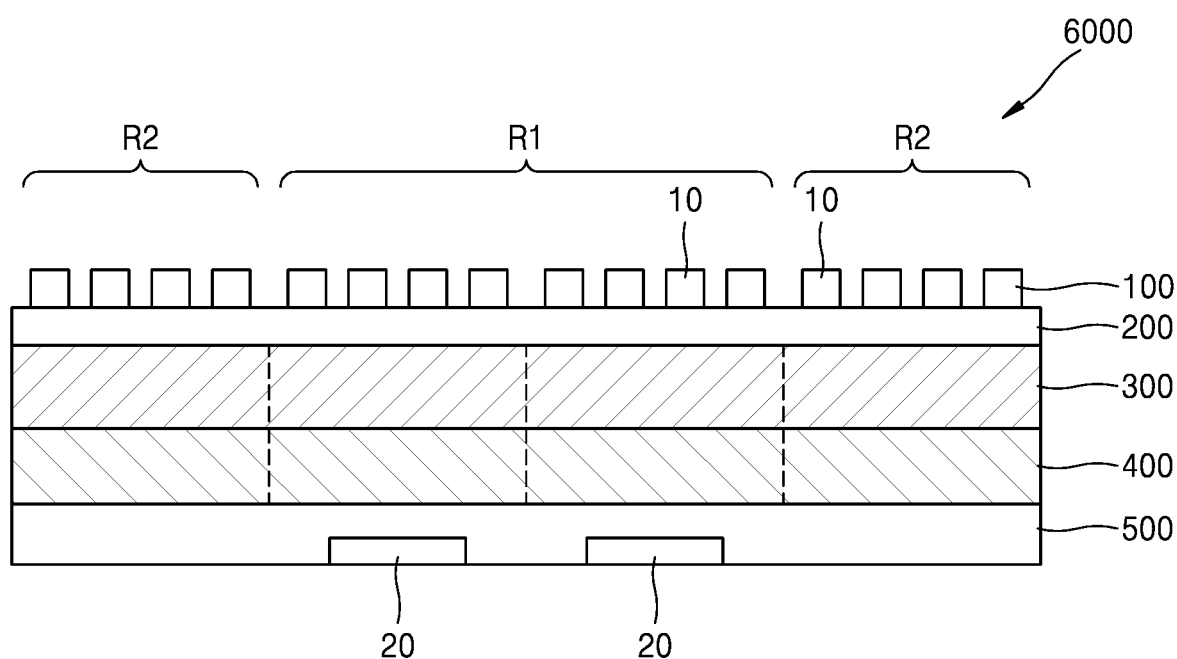
FIG. 8 is a schematic lateral cross-sectional view of a beam steering device according to another example embodiment.

FIG. 8 is a schematic lateral cross-sectional view of a beam steering device 6000 according to another example embodiment.

Referring to FIG. 8, the beam steering device 6000 for controlling a travelling direction of incident light may include: a first layer 400 including a plurality of reflection regions 420; a second layer 300 on the first layer 400 and including a plurality of refractive index-variable regions 320 having a refractive index that is controlled by an applied voltage; an antenna layer 100 above the second layer 300 and including a plurality of nano-structures 10 having a sub-wavelength size; and a driving circuit layer 500 on a lower side of the first layer 400 and including a plurality of circuit units 20 that respectively control a voltage applied to the refractive index-variable regions 320. The antenna layer 100 may be divided into a first region R1 configured to control a travelling direction of incident light and a second region R2 not configured to control a travelling direction of the incident light. Also, the beam steering device 6000 may further include a first insulating layer 200 arranged between the second layer 300 and the antenna layer 100. Constituent materials of each of the layers in the beam steering device 6000 may be the same as the constituent materials of each of the layers in the beam steering device 1000 of FIG. 3.

Also, the circuit units 20 included in the driving circuit layer 500 may be arranged on locations of the driving circuit layer 500 corresponding to the first region R1. The circuit units 20 arranged on locations of the driving circuit layer 500 corresponding to the first region R1 may change a refractive index of the refractive index-variable regions arranged on a location of the second layer 300 corresponding to the first region R1. As a result, the beam steering device 6000 may change a travelling path of light incident to the first region R1 of incident light. In this way, the first region R1 is used as a steering region by arranging the circuit units 20 on a location of the driving circuit layer 500 corresponding to the first region R1, and thus, the efficiency of beam steering function of the beam steering device 6000 may be increased.

Figure 9:
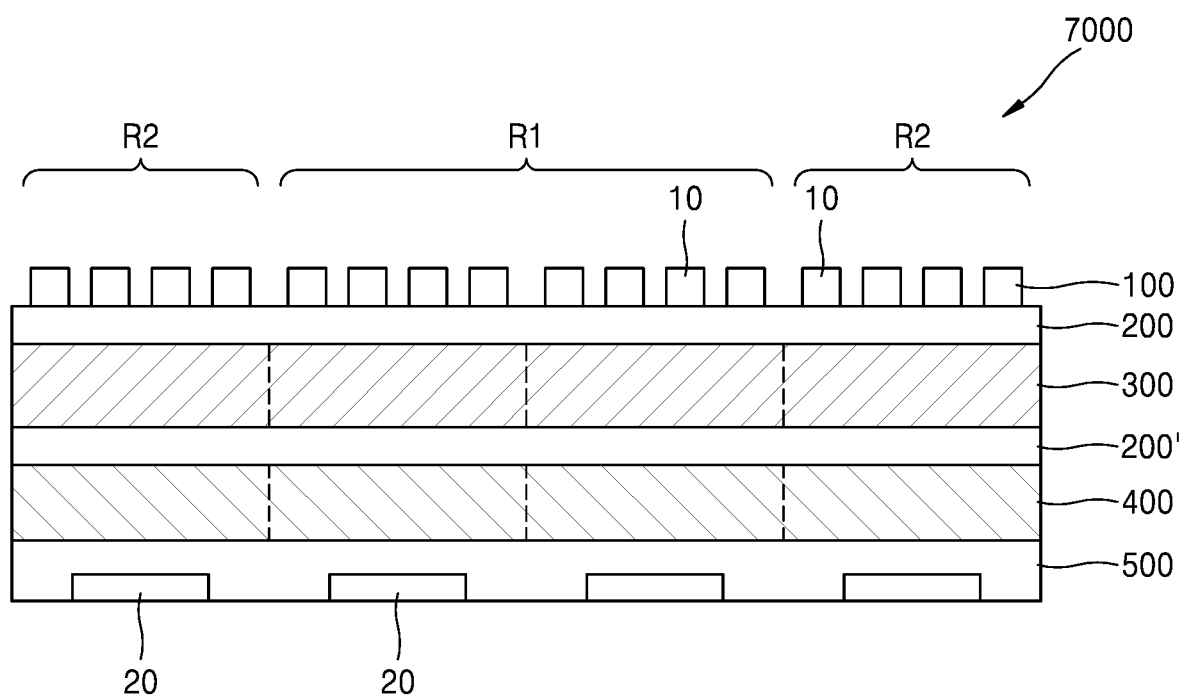
FIG. 9 is a schematic lateral cross-sectional view of a beam steering device according to another example embodiment.

FIG. 9 is a schematic lateral cross-sectional view of a beam steering device 7000 according to another example embodiment.

Referring to FIG. 9, the beam steering device 7000 for controlling a travelling direction of incident light may include: a first layer 400 including a plurality of reflection regions; a second layer 300 on the first layer 400 and including a plurality of refractive index-variable regions having a refractive index that is controlled by an applied voltage; an antenna layer 100 above the second layer 300 and including a plurality of nano-structures 10 having a sub-wavelength size; and a driving circuit layer 500 on a lower side of the first layer 400 and includes a plurality of circuit units 20 respectively configured to control a voltage applied to the refractive index-variable regions. The antenna layer 100 may be divided into a first region R1 configured to control a travelling direction of incident light and a second region R2 not configured to control a travelling direction of the incident light. Also, the beam steering device 7000 may further include a first insulating layer 200 arranged between the second layer 300 and the antenna layer 100. Constituent materials of each of the layers in the beam steering device 7000 may be the same as the constituent materials of each of the layers in the beam steering device 1000 of FIG. 3.

Also, the beam steering device 7000 may further include a second insulating layer 200' between the first layer 400 and the second layer 300. When the beam steering device 7000 further includes the second insulating layer 200', the driving circuit layer 500 may apply a voltage between the first layer 400 and the second layer 300. In the case in which a voltage is applied between the antenna layer 100 including the nano-structures 10 and the second layer 300 and in the case in which a voltage is applied between the second layer 300 and the first layer 400, different refractive index changes may be caused in the second layer 300. Accordingly, a beam steering in multiple possible directions with respect to incident light may further be performed by arranging the second insulating layer 200' in the beam steering device 7000.

Figure 10:
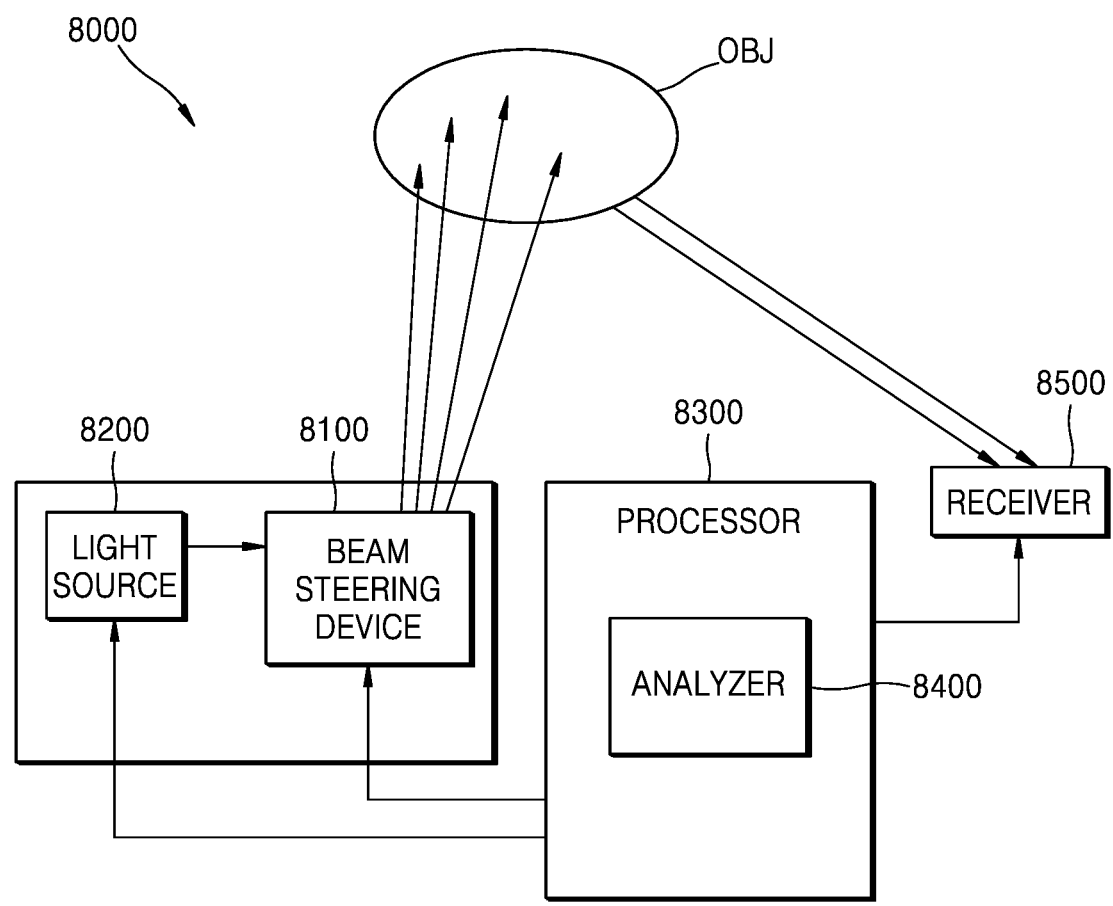
FIG. 10 is a schematic block diagram of an electronic device including a beam steering device according to an example embodiment.

FIG. 10 is a schematic block diagram of an electronic device 8000 including a beam steering device according to an example embodiment.

Referring to FIG. 10, the electronic device 8000 may include: a light source 8200 for emitting light; a beam steering device 8100 configured to control the travelling direction of the light emitted from the light source 8200 towards an object OBJ; a receiver 8500 for receiving the light reflected by the object OBJ; and a processor 8300 that processes light by classifying the light irradiated onto the object OBJ according to multiple directions by analyzing a locational and/or time distribution of light received by the receiver 8500.

The light source 8200 may irradiate a light beam to be used for analyzing location and shape of the object OBJ. The light source 8200 may include a light source that generates light of a predetermined wavelength band, for example, light of an infrared band wavelength suitable for analyzing location and shape of the object OBJ. The light source 8200 may include, for example, a laser diode (LD), a light emitting diode (LED), a super luminescent diode (SLD), or tunable laser diode (TLD), etc. The light source 8200 may generate and irradiate light of wavelength bands different from each other. The light source 8200 may generate and irradiate pulse light or continuous light.

The beam steering device 8100 may be the beam steering devices 1000, 3000, 4000, 5000, 6000, and 7000 according to the example embodiments described with reference to FIGS. 1 through 9.

The processor 8300 may control an overall operation of the electronic device 8000. The processor 8300 may include an analyzer 8400 that processes light by classifying the light irradiated onto the object OBJ according to the one of multiple directions in which the light is output from the beam steering device 8100 by analyzing a locational and/or time distribution of light received by the receiver 8500.

The electronic device 8000 including a beam steering device according to one of the example embodiments described above may be a light detection and ranging (LiDAR) system. The LiDAR system may detect a distance to an object, a direction, a temperature, a material distribution, and concentration characteristics of the object by irradiating a laser onto to a target material of the object. The LiDAR system may be used as a laser scanner and a three dimensional (3D) image camera for an autonomous vehicle. The LiDAR system may be applied to a LiDAR system for automobiles, a LiDAR system for robots, a LiDAR system for drones, etc.

In addition to the above, the beam steering devices according to the example embodiments may be applied to an intruder sensing system for security, an obstacle sensing system for subway screen doors, a 3D sensor, a depth sensor, a user face recognition sensor in a mobile phone, augmented reality (AR), motion recognition and object profiling on a TV or an entertainment device.

The beam steering devices according to the example embodiments may increase light emission efficiency by including a non-steering region and a steering region.

While one or more example embodiments have been described with reference to the figures, it will be understood by those of ordinary skill in the art that the example embodiments described above are merely examples and various changes in form and details may be made therein without departing from the spirit and scope of the disclosure. Accordingly, the technical scope of the disclosure should be defined by the technical scope of the appended claims.

What is claimed is:

1. A beam steering device for controlling a travelling direction light, the device comprising:
a first layer comprising a plurality of reflection regions;
a second layer on an upper side of the first layer and comprising a plurality of refractive-index-variable regions, each of the plurality of refractive-index variable regions having a refractive index that is controlled by a voltage applied thereto;
an antenna layer on an upper side of the second layer and comprising a plurality of nano-structures, each of the plurality of nano-structures having a size comprising a sub-wavelength dimension; and
a driving circuit layer on a lower side of the first layer and comprising a plurality of circuit units respectively configured to control voltages applied to the plurality of refractive-index-variable regions,
wherein the antenna layer comprises a first region comprising at least one first nano-structure configured to control a direction of light transmitted therefrom and a second region comprising at least one second nano-structure not configured to control a direction of light transmitted therefrom, and
wherein a distance between the first region and a center of the antenna layer is less than a distance between the second region and the center of the antenna layer.

2. The beam steering device of claim 1, wherein the second region surrounds the first region.

3. The beam steering device of claim 1, wherein the plurality of refractive-index-variable regions are disposed at locations in the second layer corresponding to a location of the first region in the antenna layer.

4. The beam steering device of claim 3, wherein the second layer further comprises a plurality of other regions disposed at locations in the second layer corresponding to a location of the second region in the antenna layer, and wherein a material of the other regions of the second layer is different from a material of the plurality of refractive-index-variable regions.

5. The beam steering device of claim 4, wherein the reflection regions are disposed at locations in the first layer corresponding to a location of the first region of the antenna layer.

6. The beam steering device of claim 1, wherein the plurality of reflection regions are provided at locations in the first layer corresponding to a location of the first region of the antenna layer.

7. The beam steering device of claim 1, wherein the plurality of circuit units are disposed at locations in the driving circuit layer corresponding to a location of the first region in the antenna layer.

8. The beam steering device of claim 1, further comprising a controller configured to control the plurality of circuit units of the driving circuit layer.

9. The beam steering device of claim 8, wherein the controller controls circuit units disposed at locations in the driving circuit layer corresponding to a location of the first region in the antenna layer, such that at least one voltage is applied between the plurality of nano-structures in the first region of the antenna layer and reflection regions disposed at locations in the first layer corresponding to the location of the first region in the antenna layer.

10. The beam steering device of claim 1, wherein each of the plurality of refractive-index-variable regions comprises a semiconductor material.

11. The beam steering device of claim 1, further comprising a first insulating layer between the second layer and the antenna layer.

12. The beam steering device of claim 1, further comprising a second insulating layer between the second layer and the first layer.

13. An electronic device comprising:
a light source;
the beam steering device of claim 1, configured to direct light incident from the light source towards an object by controlling a travelling direction of the light;
a receiver configured to receive light reflected from the object; and
a processor configured to analyze the light received by the receiver.

14. A beam steering device for controlling a travelling direction light, the device comprising:
a first layer comprising a plurality of reflection regions;
a second layer on an upper side of the first layer and comprising a plurality of refractive-index-variable regions, each of the plurality of refractive-index variable regions having a refractive index that is controlled by a voltage applied thereto;
an antenna layer on an upper side of the second layer and comprising a plurality of nano-structures, each of the plurality of nano-structures having a size comprising a sub-wavelength dimension; and
a driving circuit layer on a lower side of the first layer and comprising a plurality of circuit units respectively configured to control voltages applied to the plurality of refractive-index-variable regions,
wherein the antenna layer comprises a first region comprising at least one first nano-structure configured to control a direction of light transmitted therefrom and a second region comprising at least one second nano-structure not configured to control a direction of light transmitted therefrom, and
wherein a distribution of at least one of a size and a shape of the plurality of the nano-structures of the first region is less than a distribution of at least one of a size and a shape of the plurality of nano-structures of the second region.

15. An electronic device comprising:
a light source;
the beam steering device of claim 14, configured to direct light incident from the light source towards an object by controlling a travelling direction of the light;
a receiver configured to receive light reflected from the object; and
a processor configured to analyze the light received by the receiver.

16. A beam steering device for controlling a travelling direction light, the device comprising:
a first layer comprising a plurality of reflection regions;
a second layer on an upper side of the first layer and comprising a plurality of refractive-index-variable regions, each of the plurality of refractive-index variable regions having a refractive index that is controlled by a voltage applied thereto;
an antenna layer on an upper side of the second layer and comprising a plurality of nano-structures, each of the plurality of nano-structures having a size comprising a sub-wavelength dimension; and
a driving circuit layer on a lower side of the first layer and comprising a plurality of circuit units respectively configured to control voltages applied to the plurality of refractive-index-variable regions,
wherein the antenna layer comprises a first region comprising at least one first nano-structure configured to control a direction of light transmitted therefrom and a second region comprising at least one second nano-structure not configured to control a direction of light transmitted therefrom,
wherein the plurality of reflection regions are provided at locations in the first layer corresponding to a location of the first region of the antenna layer, and
wherein the first layer further comprises a plurality of other regions disposed at locations in the first layer corresponding to a location of the second region in the antenna layer, and wherein a material of the other regions of the first layer is different from a material of the plurality of reflection regions.

17. The beam steering device of claim 5, A beam steering device for controlling a travelling direction light, the device comprising:
a first layer comprising a plurality of reflection regions;
a second layer on an upper side of the first layer and comprising a plurality of refractive-index-variable regions, each of the plurality of refractive-index variable regions having a refractive index that is controlled by a voltage applied thereto;
an antenna layer on an upper side of the second layer and comprising a plurality of nano-structures, each of the plurality of nano-structures having a size comprising a sub-wavelength dimension; and
a driving circuit layer on a lower side of the first layer and comprising a plurality of circuit units respectively configured to control voltages applied to the plurality of refractive-index-variable regions,
wherein the antenna layer comprises a first region comprising at least one first nano-structure configured to control a direction of light transmitted therefrom and a second region comprising at least one second nano-structure not configured to control a direction of light transmitted therefrom,
wherein the plurality of refractive-index-variable regions are disposed at locations in the second layer corresponding to a location of the first region in the antenna layer,
wherein the second layer further comprises a plurality of other regions disposed at locations in the second layer corresponding to a location of the second region in the antenna layer, and wherein a material of the other regions of the second layer is different from a material of the plurality of refractive-index-variable regions,
wherein the reflection regions are disposed at locations in the first layer corresponding to a location of the first region of the antenna layer, and
wherein the first layer further comprises a plurality of other regions disposed at locations in the first layer corresponding to a location of the second region in the antenna layer, and wherein a material of the other regions of the first layer is different from a material of the plurality of reflection regions.

18. The beam steering device of claim 17, wherein the material of the other regions of the first layer is a same material as the material of the other regions of the second layer.

19. An electronic device comprising:
a light source;
a beam steering device configured to direct light incident from the light source towards an object by controlling a travelling direction of the light;
a receiver configured to receive light reflected from the object; and
a processor configured to analyze the light received by the receiver,
wherein the beam steering device comprises:
   a first layer comprising a plurality of reflection regions;
   a second layer on an upper side of the first layer and comprising a plurality of refractive-index-variable regions, each of the plurality of refractive-index variable regions having a refractive index that is controlled by a voltage applied thereto;
   an antenna layer on an upper side of the second layer and comprising a plurality of nano-structures, each of the plurality of nano-structures having a size comprising a sub-wavelength dimension; and
   a driving circuit layer on a lower side of the first layer and comprising a plurality of circuit units respectively configured to control voltages applied to the plurality of refractive-index-variable regions;
wherein the antenna layer comprises a first region comprising at least one first nano-structure configured to control a direction of light transmitted therefrom and a second region comprising at least one second nano-structure not configured to control a direction of light transmitted therefrom, and
wherein, at least one of the plurality of refractive-index-variable regions and the plurality of reflection regions is respectively provided at locations of the second layer and the first layer corresponding to a location of the first region in the antenna layer, and is not respectively provided at locations of the second layer and the first layer corresponding to a location of the second region in the antenna layer.

20. A beam steering device comprising:
an antenna structure comprising an antenna layer disposed comprising a first plurality of nano-structures disposed in a first region and a second plurality of nano-structures disposed in a second region, different from the first region and surrounding the first region, wherein a distribution of at least one of sizes and shapes of the first plurality of nano-structures is smaller than a distribution of at least one of sizes and shapes of the second plurality of nano-structures;
an auxiliary structure, disposed under the antenna layer and comprising a first region, disposed in a location corresponding to a location of the first region of the antenna layer, and a second region, disposed in a location corresponding to a location of the second region of the antenna layer;
wherein the first region of the auxiliary structure comprises:
a second layer disposed under the antenna layer and comprising a plurality of refractive-index variable regions, each having a refractive index that is controlled by a voltage applied thereto;
a first layer disposed under the second layer and comprising a plurality of reflection regions; and
a driving circuit layer disposed under the first layer and comprising a plurality of circuit units respectively configured to control voltages applied to the plurality of refractive-index variable regions; and
wherein the second region of the auxiliary structure omits at least one of:
any refractive-index variable regions,
any reflection regions, and
any circuit units.

* * * * *